(12) United States Patent
Chen et al.

(10) Patent No.: US 11,695,435 B2
(45) Date of Patent: Jul. 4, 2023

(54) DATA TRANSMISSION METHOD, APPARATUS, AND SYSTEM

(71) Applicant: HUAWEI TECHNOLOGIES CO., LTD., Guangdong (CN)

(72) Inventors: Ying Chen, Hangzhou (CN); Hejia Luo, Hangzhou (CN); Gongzheng Zhang, Hangzhou (CN); Rong Li, Hangzhou (CN); Jun Wang, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/929,621

(22) Filed: Jul. 15, 2020

(65) Prior Publication Data

US 2020/0350932 A1 Nov. 5, 2020

Related U.S. Application Data

(63) Continuation of application No. PCT/CN2019/071823, filed on Jan. 15, 2019.

(30) Foreign Application Priority Data

Jan. 16, 2018 (CN) .......................... 201810041373.1

(51) Int. Cl.
*H03M 13/00* (2006.01)
*H03M 13/13* (2006.01)
(Continued)

(52) U.S. Cl.
CPC ....... *H03M 13/6362* (2013.01); *H03M 13/13* (2013.01); *H04L 1/0013* (2013.01); *H04L 1/0061* (2013.01); *H04L 5/0055* (2013.01)

(58) Field of Classification Search
None
See application file for complete search history.

(56) References Cited

U.S. PATENT DOCUMENTS

2016/0182187 A1* 6/2016 Kim ..................... H03M 13/356
714/807
2016/0285479 A1* 9/2016 El-Khamy .......... H03M 13/616
(Continued)

FOREIGN PATENT DOCUMENTS

CN          106027068 A      10/2016
CN          106817195 A       6/2017
(Continued)

OTHER PUBLICATIONS

NTT DOCOMO, "Segmentation of Polar codes for UCI", 3GPP TSG RAN WG1 Meeting 91,R1-1720828, Dec. 1, 2017, total 5 pages.
(Continued)

*Primary Examiner* — Mujtaba M Chaudry
(74) *Attorney, Agent, or Firm* — Womble Bond Dickinson (US) LLP

(57) ABSTRACT

This application discloses a data transmission method, apparatus, and system. The method includes: generating a to-be-sent bit sequence, where the to-be-sent bit sequence includes one or more bits in a bit sequence having a length of (N−M), where N is a length of a mother code for polar encoding, M is a length of encoded bits obtained after rate matching is performed on a bit sequence having a length of N, N is m raised to the power of an integer, m is a positive integer greater than 1, M is a positive integer, and N>M; and sending the generated bit sequence. A corresponding apparatus and system are further disclosed. In this application, in this data transmission solution, an additional coding gain is generated during decoding, so that a decoding FER is reduced, and decoding performance is improved.

10 Claims, 11 Drawing Sheets

(51) Int. Cl.
*H04L 1/00* (2006.01)
*H04L 5/00* (2006.01)

(56) References Cited

U.S. PATENT DOCUMENTS

| | | | |
|---|---|---|---|
| 2017/0005753 A1* | 1/2017 | Shen | H04L 1/1819 |
| 2017/0012739 A1* | 1/2017 | Shen | H04L 1/0041 |
| 2017/0047947 A1* | 2/2017 | Hong | H03M 13/2906 |
| 2017/0222757 A1* | 8/2017 | Huang | H03M 13/13 |
| 2017/0331590 A1* | 11/2017 | Wu | H04L 1/1819 |
| 2018/0026663 A1* | 1/2018 | Wu | H03M 13/6362 714/776 |
| 2018/0076923 A1* | 3/2018 | Wu | H03M 13/29 |

FOREIGN PATENT DOCUMENTS

| | | |
|---|---|---|
| CN | 107342843 A | 11/2017 |
| CN | 107425941 A | 12/2017 |
| CN | 107508653 A | 12/2017 |
| EP | 3113400 A1 | 1/2017 |

OTHER PUBLICATIONS

RAN1, LS on Channel Coding . 3GPP TSG RAN WG4 Meeting #84Bis, Dubrovnik, Croatia, Oct. 9-13, 2017, R4-1710120, 18 pages.

Huawei et al.,"IR-HARQ scheme for polar codes",3GPP TSG RAN WG1 NR Ad-Hoc Meeting R1-1700406,Spokane, USA, Jan. 16-20, 2017,total 4 pages.

Liang Ma et al: "An Incremental Redundancy HARQ Scheme for Polar Code",Aug. 31, 2017,total 6 pages.

* cited by examiner

DATA TRANSMISSION METHOD, APPARATUS, AND SYSTEM

CROSS-REFERENCE TO RELATED APPLICATIONS

This application is a continuation of International Application No. PCT/CN2019/071823, filed on Jan. 15, 2019, which claims priority to Chinese Patent Application No. 201810041373.1, filed on Jan. 16, 2018. The disclosures of the aforementioned applications are hereby incorporated by reference in their entireties.

TECHNICAL FIELD

This application relates to the field of communications technologies, and in particular, to a data transmission method, apparatus, and system.

BACKGROUND

Rapid evolution of wireless communication indicates that a future fifth generation (5G) communications system will present some new features. The most typical three communications scenarios include enhanced mobile broadband (eMBB), massive machine type communications (mMTC), and ultra-reliable and low latency communications (URLLC). Requirements of the communications scenarios pose new challenges to existing long term evolution (LTE) technologies. Channel coding, as a most basic radio access technology, is an important research object to meet a 5G communications requirement. A polar code is the first good code that has low encoding and decoding complexity and that theoretically proves that a Shannon capacity can be obtained.

A typical scenario in 5G is communication that has a relatively high reliability requirement but is insensitive to a delay. A most commonly used method is to improve communications reliability by using a hybrid automatic repeat request (HARQ), so that a higher link throughput is achieved.

However, in the prior art, in a polar code HARQ scheme, a same sequence is repeatedly sent during each retransmission until an acknowledgment (ACK) feedback signal is received, and a receive end combines all soft information received each time for decoding. However, decoding performance of directly retransmitting an original information bit is relatively poor, and a decoding frame error rate (FER) is relatively high.

Therefore, a data transmission solution in which a particular coding gain can be generated needs to be provided urgently.

SUMMARY

This application provides a retransmission method and a communications apparatus, so that in this data transmission solution, an additional coding gain is generated during decoding. Therefore, a decoding FER is reduced, and decoding performance is improved.

According to one aspect, a data transmission method is provided, and includes: generating a to-be-sent bit sequence, where the to-be-sent bit sequence includes one or more bits in a bit sequence having a length of (N−M), where N is a length of a mother code for polar encoding, M is a length of encoded bits obtained after rate matching is performed on a bit sequence having a length of N, N is m raised to the power of an integer, m is a positive integer greater than 1, M is a positive integer, and N>M; and sending the generated bit sequence. In this aspect, in this data transmission solution, an additional coding gain is generated during decoding, so that a decoding FER is reduced, and decoding performance is improved.

In one embodiment, the to-be-sent bit sequence further includes one or more bits in the bit sequence having the length of N.

In one embodiment, when $m\hat{\,}\text{ceil}(\log_m M)-M \leq P_t$, a length of the to-be-sent bit sequence is min $(m\hat{\,}(\text{ceil}(\log_m M)+1), \text{Nmax})$, where $P_t$ is a threshold of a quantity of punctured bits, and Nmax is a maximum length of the mother code.

In one embodiment, when N meets the following conditions: $N/2-M \leq P_t$, and $N-M \geq P_t$, a length of the to-be-sent bit sequence is min $(m\hat{\,}(\text{ceil}(\log_m M)+1), \text{Nmax})$, where $P_t$ is a threshold of a quantity of punctured bits, and Nmax is a maximum length of the mother code.

According to another aspect, a data transmission apparatus is provided, and includes: a processing module, configured to generate a to-be-sent bit sequence, where the to-be-sent bit sequence includes one or more bits in a bit sequence having a length of (N−M), where N is a length of a mother code for polar encoding, M is a length of encoded bits obtained after rate matching is performed on a bit sequence having a length of N, N is m raised to the power of an integer, m is a positive integer greater than 1, M is a positive integer, and N>M; and a sending module, configured to send the generated bit sequence.

In one embodiment, the to-be-sent bit sequence further includes one or more bits in the bit sequence having the length of N.

In one embodiment, when $m\hat{\,}\text{ceil}(\log_m M)-M \leq P_t$, a length of the to-be-sent bit sequence is min $(m\hat{\,}(\text{ceil}(\log_m M)+1), \text{Nmax})$, where $P_t$ is a threshold of a quantity of punctured bits, and Nmax is a maximum length of the mother code.

In one embodiment, when N meets the following conditions: $N/2-M \leq P_t$, and $N-M \geq P_t$, a length of the to-be-sent bit sequence is min $(m\hat{\,}(\text{ceil}(\log_m M)+1), \text{Nmax})$, where $P_t$ is a threshold of a quantity of punctured bits, and Nmax is a maximum length of the mother code.

In one embodiment, the apparatus is a network device or a terminal device.

According to still another aspect, an encoding apparatus is provided, and includes: a processor, and the processor is configured to generate a to-be-sent bit sequence, where the to-be-sent bit sequence includes one or more bits in a bit sequence having a length of (N−M), where N is a length of a mother code for polar encoding, M is a length of encoded bits obtained after rate matching is performed on a bit sequence having a length of N, N is m raised to the power of an integer, m is a positive integer greater than 1, M is a positive integer, and N>M.

In one embodiment, the to-be-sent bit sequence further includes one or more bits in the bit sequence having the length of N.

In one embodiment, when $m\hat{\,}\text{ceil}(\log_m M)-M \leq P_t$, a length of the to-be-sent bit sequence is min $(m\hat{\,}(\text{ceil}(\log_m M)+1), \text{Nmax})$, where $P_t$ is a threshold of a quantity of punctured bits, and Nmax is a maximum length of the mother code.

In one embodiment, when N meets the following conditions: $N/2-M \leq P_t$, and $N-M \geq P_t$, a length of the to-be-sent bit sequence is min $(m\hat{\,}(\text{ceil}(\log_m M)+1), \text{Nmax})$, where $P_t$ is a threshold of a quantity of punctured bits, and Nmax is a maximum length of the mother code.

In one embodiment, the apparatus further includes a memory, and the memory is configured to store a program instruction.

In one embodiment, the apparatus is a network device or a terminal device.

According to still another aspect, a data transmission apparatus is provided, and includes: an input interface circuit, configured to obtain a bit sequence when a length of a mother code is N; a logic circuit, configured to generate a to-be-sent bit sequence, where the to-be-sent bit sequence includes one or more bits in a bit sequence having a length of (N−M), where N is a length of a mother code for polar encoding, M is a length of encoded bits obtained after rate matching is performed on a bit sequence having a length of N, N is m raised to the power of an integer, m is a positive integer greater than 1, M is a positive integer, and N>M; and an output interface circuit, configured to output the to-be-sent bit sequence.

In one embodiment, the to-be-sent bit sequence further includes one or more bits in the bit sequence having the length of N.

In one embodiment, when $m^{\wedge}ceil\ (\log_m M)-M<=P_t$, a length of the to-be-sent bit sequence is min $(m^{\wedge}(ceil\ (\log_m M)+1), Nmax)$, where $P_t$ is a threshold of a quantity of punctured bits, and Nmax is a maximum length of the mother code.

In one embodiment, when N meets the following conditions: $N/2-M \leq P_t$, and $N-M \geq P_t$, a length of the to-be-sent bit sequence is min $(m^{\wedge}(ceil\ (\log_m M)+1), Nmax)$, where $P_t$ is a threshold of a quantity of punctured bits, and Nmax is a maximum length of the mother code.

In one embodiment, the apparatus is a network device or a terminal device.

According to still another aspect, a data transmission system is provided, and the data transmission system includes a network device and a terminal device, where the network device includes the foregoing data transmission apparatuses; and/or the terminal device includes the foregoing data transmission apparatuses.

According to still another aspect, a chip is provided, and includes: a processor, and the processor is configured to generate a to-be-sent bit sequence, where the to-be-sent bit sequence includes one or more bits in a bit sequence having a length of (N−M), where N is a length of a mother code for polar encoding, M is a length of encoded bits obtained after rate matching is performed on a bit sequence having a length of N, N is m raised to the power of an integer, m is a positive integer greater than 1, M is a positive integer, and N>M.

In one embodiment, the chip further includes a memory, configured to store a program.

According to still another aspect, a readable storage medium is provided, and includes a readable storage medium and a computer program, where the computer program is used to implement the encoding method according to any one of the foregoing aspects.

According to still another aspect, a program product is provided, where the program product includes a computer program, the computer program is stored in a readable storage medium, at least one processor of an encoding apparatus may read the computer program from the readable storage medium, and the at least one processor executes the computer program, to enable the encoding apparatus to implement the encoding method according to any one of the foregoing aspects.

According to still another aspect, a decoding method is provided, and includes: receiving soft information corresponding to a bit sequence, where the soft information includes soft information corresponding to one or more bits in a bit sequence having a length of (N−M), where N is a length of a mother code for polar encoding, M is a length of encoded bits obtained after rate matching is performed on a bit sequence having a length of N, N is m raised to the power of an integer, m is a positive integer greater than 1, M is a positive integer, and N>M; and combining the soft information for decoding, to obtain decoded bits.

In one embodiment, the soft information further includes one or more bits in the bit sequence having the length of N.

According to still another aspect, a decoding apparatus is provided, and includes: a receiving module, configured to receive soft information corresponding to a bit sequence, where the soft information includes soft information corresponding to one or more bits in a bit sequence having a length of (N−M), where N is a length of a mother code for polar encoding, M is a length of encoded bits obtained after rate matching is performed on a bit sequence having a length of N, N is m raised to the power of an integer, m is a positive integer greater than 1, M is a positive integer, and N>M; and a processing module, configured to combine the soft information for decoding, to obtain decoded bits.

BRIEF DESCRIPTION OF DRAWINGS

To describe the technical solutions in the embodiments of this application or in the background more clearly, the following describes the accompanying drawings for describing the embodiments of this application or the background.

DESCRIPTION OF EMBODIMENTS

The following describes the embodiments of this application with reference to the accompanying drawings in the embodiments of this application.

Figure 1:
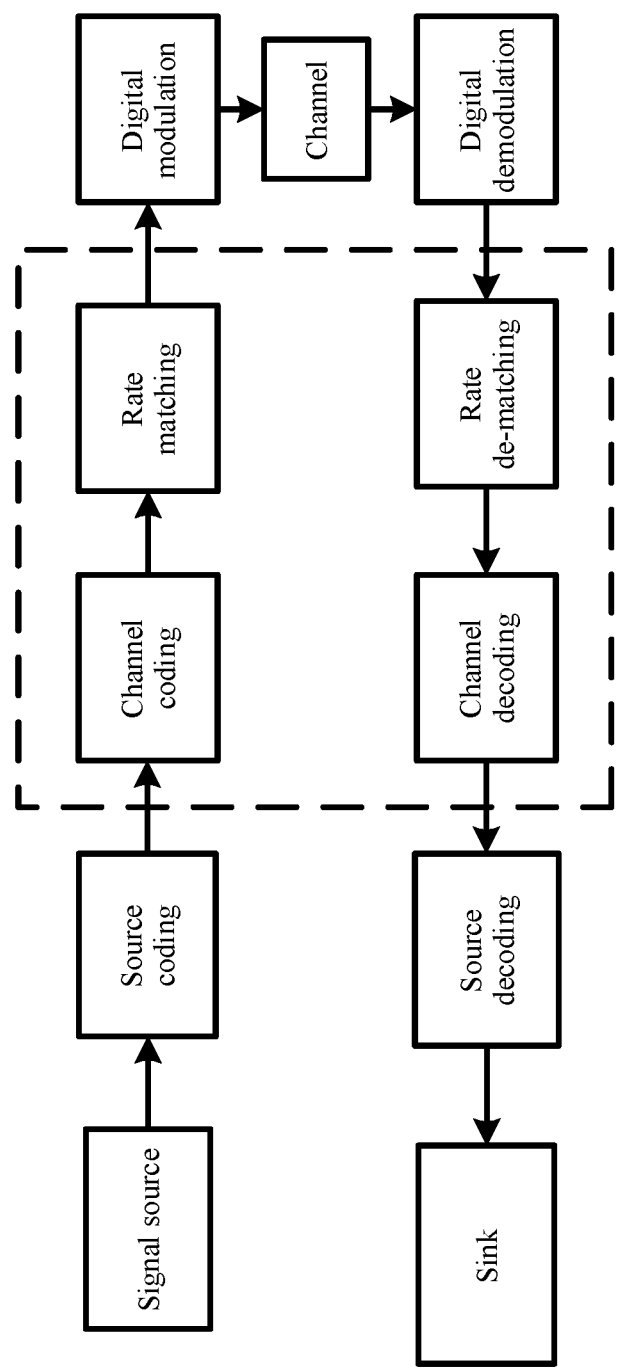
FIG. 1 is a schematic diagram of channel coding in a communications link.

FIG. 1 is a schematic diagram of channel coding in a communications link. A transmit end obtains a signal by performing source coding, channel coding, rate matching, and digital modulation on information, and sends the signal by using a channel. A receive end receives the signal by using the channel, and finally restores the information by performing digital demodulation, rate de-matching, channel decoding, and source decoding on the signal.

An embodiment of this application provides a data transmission solution. A retransmission manner in the data transmission solution may be an HARQ transmission manner, or may be another retransmission manner. The following mainly describes an HARQ transmission mechanism.

In the HARQ transmission mechanism, channel coding and automatic repeat request technologies are combined. A small-scale error that occurs during transmission can be directly corrected through channel coding. A transmission error that cannot be corrected by using a channel coding error correction capability is notified by the receive end to the transmit end by using a feedback link, to request resending the message.

Figure 2:
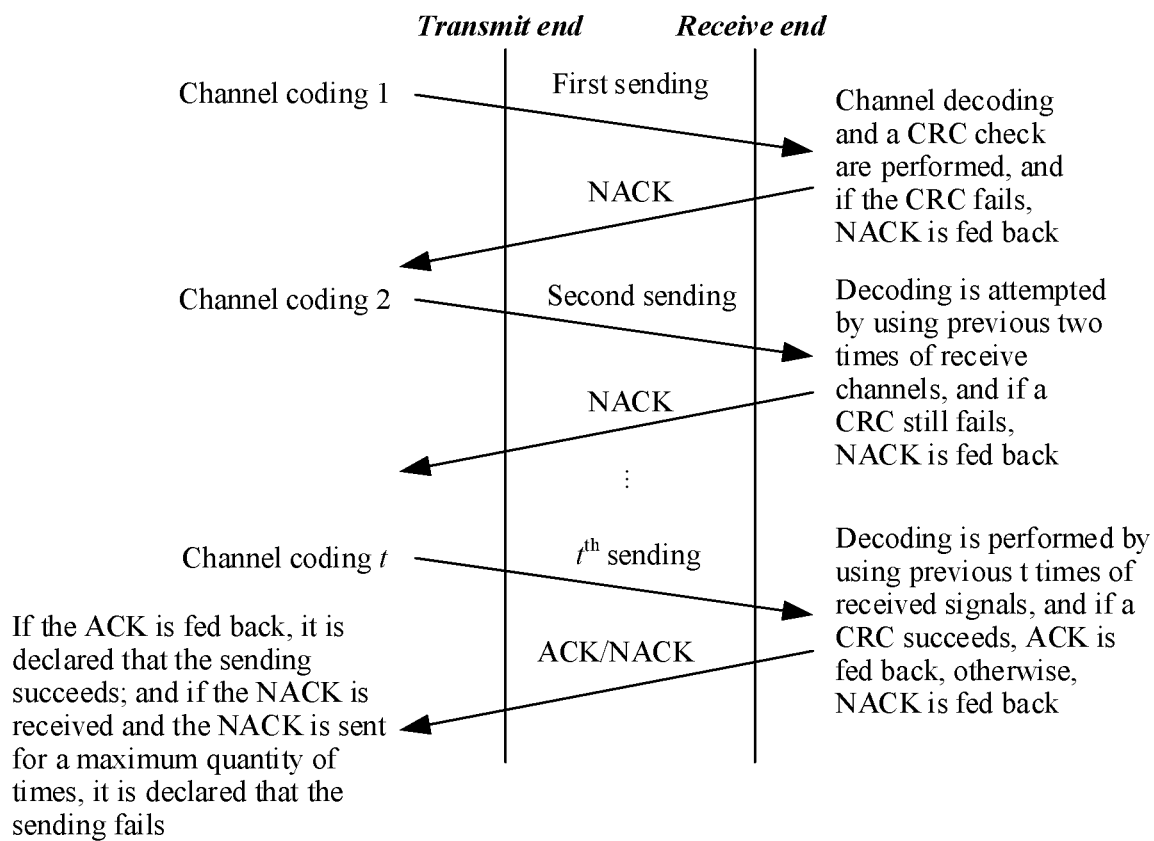
FIG. 2 is a schematic diagram of HARQ transmission.

In a schematic diagram of HARQ transmission shown in FIG. 2, if decoding fails at a receive end (for example, a cyclic redundancy check (CRC) fails), a negative acknowledgment (NACK) message is transmitted to a transmit end by using a feedback link, and the transmit end sends new data. The process continues until the receive end sends an acknowledgment (ACK) message to the transmit end for notifying the transmit end that decoding is correct, so that transmission of an information block is completed.

The transmit end sends the new data to the receive end. The new data herein may include one or more bits in a bit sequence having a length of (N−M), where N is a length of a mother code for polar encoding, M is a length of encoded bits obtained after rate matching is performed on a bit sequence having a length of N, N is m raised to the power of an integer, m is a positive integer greater than 1, M is a positive integer, and N>M. Based on the data, by using an additional coding gain, the receive end may reduce a decoding FER and improve decoding performance.

In addition, in the data transmission solution of this application, a plurality of types of codes may be used for encoding and decoding. The following mainly and briefly describes encoding and decoding of a polar code.

The polar code is a linear block code. A generator matrix of the polar code is $G_N$, and an encoding process of the polar code is $x_1^N = u_1^N G_N$, where $u_1^N = (u_1, u_2, K, u_N)$ is a binary row vector having a length (that is, a code length) of N. $G_N$ is a matrix of N×N, and $G_N = F_2^{\otimes(\log_2(N))}$, where $F_2 \begin{bmatrix} 1 & 0 \\ 1 & 1 \end{bmatrix}$, $F_2^{\otimes(\log_2(N))}$ is defined as a Kronecker product of $\log_2 N$ matrices $F_2$. Both addition and multiplication operations mentioned above are addition and multiplication operations in a binary Galois field.

In the encoding process of the polar code, some bits of $u_1^N$ are used to carry information, and are referred to as information bits, and a set of indexes of the information bits is denoted as A; and some other bits of $u_1^N$ are set to fixed values on which the receive end and the transmit end agree in advance, and are referred to as constant bits, and a set of indexes of the constant bits is represented by using a complementary set $A^c$ of A. An information bit sequence number set A is selected based on the following method. A polar channel error probability $P_e^{(i)}$ corresponding to a bit having a sequence number i may first be obtained based on a constructing algorithm of the polar code, and K sequence numbers having smallest $P_e^{(i)}$ values are then selected to construct the set A. Alternatively, a reliability sorting sequence that meets an inclusion relationship may be stored offline, and K polar channel sequence numbers having highest reliability in a current mother code are read from the sequence based on K and N, to construct the set A.

A most basic decoding method of the polar code is a successive cancellation (SC) decoding method. However, in the algorithm, performance is not ideal when the code length is limited. A successive cancellation list (SCL) decoding algorithm subsequently proposed improves decoding performance of a short code by using a method of transverse path extension and CRC check selection. The decoding algorithm can be used to obtain, when the polar code, a Turbo code, and a low-density parity-check code have equivalent decoding complexity, frame error rate (FER) performance that is better than frame error rate performance of the Turbo code and the low-density parity-check (LDPC) code.

Figure 3:
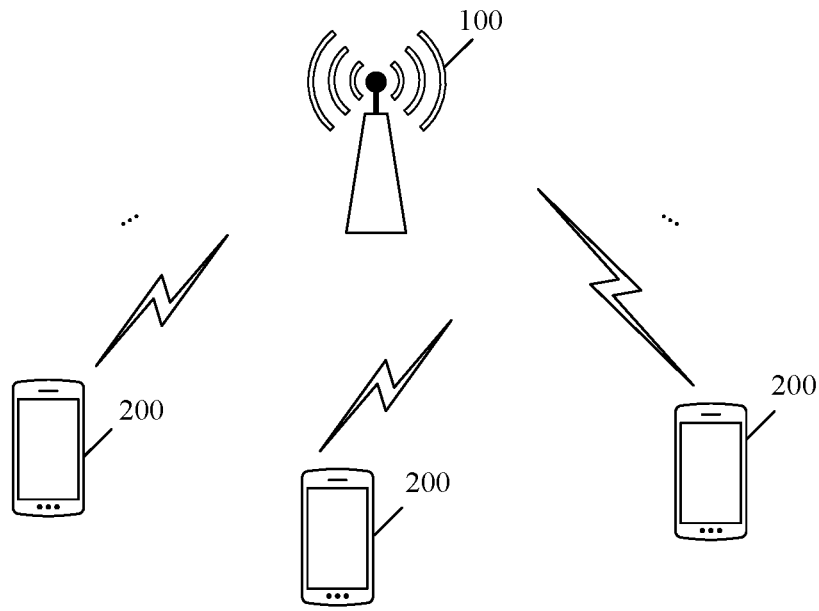
FIG. 3 is a schematic diagram of a communications system according to an embodiment of this application.

FIG. 3 is a schematic diagram of a communications system according to an embodiment of this application. The communications system may include at least one network device 100 (only one network device is shown) and one or more terminal devices 200 connected to the network device 100. In this application, if a transmit end device may be a terminal device, a receive end device may be a network device. Alternatively, if a transmit end device may be a network device, a receive end device may be a terminal device.

The network device 100 may be a device that can communicate with the terminal device 200. The network device 100 may be any device having a wireless transceiver function. The device includes but is not limited to a base station (for example, a NodeB, an evolved NodeB (eNodeB), a base station in the fifth generation (5G) communications system, a base station or a network device in a future communications system, an access node in a Wi-Fi system, a wireless relay node, or a wireless backhaul node), or the like. Alternatively, the network device 100 may be a radio controller in a cloud radio access network (CRAN) scenario. Alternatively, the network device 100 may be a network device in a 5G network or a network device in a future evolved network, or may be a wearable device, a vehicle-mounted device, or the like. Alternatively, the network device 100 may be a small cell, a transmission node (transmission reference point (TRP)), or the like. Certainly, this application is not limited thereto.

The terminal device 200 is a device having a wireless transceiver function. The device may be deployed on the land, including an indoor or outdoor device, a handheld device, a wearable device, or a vehicle-mounted device. The device may alternatively be deployed on the water (for example, on a ship). The device may alternatively be deployed over the air (for example, over an aircraft, a balloon, or a satellite). The terminal device may be a mobile phone (mobile phone), a tablet (Pad), a computer having a wireless transceiver function, a virtual reality (VR) terminal device, an augmented reality (AR) terminal device, a wireless terminal in industrial control, a wireless terminal in self driving, a wireless terminal in telemedicine (remote medical), a wireless terminal in a smart grid, a wireless terminal for transportation safety, a wireless terminal in a smart city), a wireless terminal in a smart home, or the like. An application scenario is not limited in this embodiment of this application. The terminal device sometimes may alternatively be referred to as user equipment (UE), an access terminal device, a UE unit, a UE station, a mobile station, a mobile console, a remote station, a remote terminal device, a mobile device, a UE terminal device, a terminal, a terminal device, a wireless communications device, a UE agent, a UE apparatus, or the like.

It should be noted that the terms "system" and "network" may be used interchangeably in the embodiments of this application. "A plurality of" means two or more. In view of this, "a plurality of" may also be understood as "at least two" in the embodiments of this application. The term "and/or" describes an association relationship for describing associated objects and represents that three relationships may exist. For example, A and/or B may represent the following three cases: Only A exists, both A and B exist, and only B exists. In addition, unless otherwise stated, the character "/" generally indicates an "or" relationship between the associated objects.

The embodiments of this application provide a data transmission method and apparatus. In the data transmission solution, an additional coding gain is generated during decoding, so that a decoding FER is reduced, and decoding performance is improved.

Figure 4:
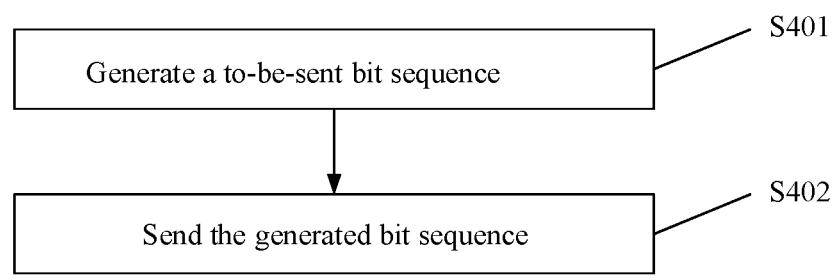
FIG. 4 is a schematic flowchart of a data transmission method according to an embodiment of this application.

FIG. 4 is a schematic flowchart of a data transmission method according to an embodiment of this application. The method includes the following operations.

S401: Generate a to-be-sent bit sequence, where the to-be-sent bit sequence includes one or more bits in a bit sequence having a length of (N−M), where N is a length of a mother code for polar encoding, M is a length of encoded bits obtained after rate matching is performed on a bit sequence having a length of N, N is m raised to the power of an integer, m is a positive integer greater than 1, M is a positive integer, and N>M.

S402: Send the generated bit sequence.

In this embodiment, polar encoding is first performed on the mother code having the length of N, to obtain that the length of the encoded bits obtained after rate matching is performed is M. The M encoded bits and (N−M) bits are sequentially sent. In one embodiment, the M encoded bits are initially transmitted, and then one or more bits in the (N−M) bits are retransmitted, or one or more bits in the M initially transmitted bits may be retransmitted. The M encoded bits and the (N−M) bits may be stored in a buffer, and the bits in the buffer are sequentially read for sending until a length of bits sent during initial transmission or a length of bits sent during retransmission is reached.

For example, m=2, that is, the length of the mother code is 2 raised to the power of an integer. Certainly, m may alternatively be another value.

Further, interleaving and rate matching are performed on the mother code, to obtain the M encoded bits.

Further, the to-be-sent bit sequence further includes one or more bits in the bit sequence having the length of N. In this embodiment, before or after the bit sequence having the length of (N−M) is sent, one or more bits in a bit sequence having the length of N are further sent.

In this embodiment, encoding and decoding of a polar code is used as an example to describe the data transmission solution. In one embodiment, before encoded, the polar code is first constructed based on an actual parameter (including a length N of a to-be-encoded sequence $u_1^N$, a length K of to-be-transmitted information bits, or the like), and a preferred polar channel is selected through online calculation or table reading, to generate an information bit sequence number set A. Some other bits are set to fixed values on which a receive end and a transmit end agree in advance, and are referred to as constant bits, and a set of indexes of the constant bits is represented by using a complementary set $A^c$ of A.

In this embodiment, a value of the length N of the mother code of the polar code needs to be designed.

In one embodiment, the value of the length N of the mother code is determined. When $m\text{\textasciicircum}ceil\,(\log_m M)-M <= P_t$, the value of the length N of the mother code is min ($m\text{\textasciicircum}(ceil\,(\log_m M)+1)$, Nmax), where "$m\text{\textasciicircum}ceil\,(\log_m M)$" represents an encoding length that is closest to M and that is greater than or equal to M, $P_t$ represents a threshold of a quantity of punctured bits, and $N_{max}$ is a maximum length that is of the mother code and that is preset in a polar code system. When $m\text{\textasciicircum}(ceil\,(\log_m M)+1) < N_{max}$, the value of the length N of the mother code is $m\text{\textasciicircum}(ceil\,(\log_m M)+1)$; when $m\text{\textasciicircum}(ceil\,(\log_m M)+1) > N_{max}$, the value of the length N of the mother code is $N_{max}$; or when $m\text{\textasciicircum}(ceil\,(\log_m M)+1)-N_{max}$, the value of the length N of the mother code is $m\text{\textasciicircum}(ceil\,(\log_m M)+1)$, or $N_{max}$, $P_t$ is a threshold of a quantity of punctured bits, and Nmax is a maximum length that is of the mother code and that is set in the system. In one embodiment, when the length of the mother code is designed, it is considered that the length of the mother code is selected as long as possible, so that (N−M) bits can be generated as many as possible for selection. Such consideration is applied to a retransmission scenario. During retransmission, the (N−M) bits are used for retransmission, to generate a coding gain. By using the additional coding gain during decoding, a decoding FER is reduced and decoding performance is improved.

In one embodiment, the length N of the mother code may be designed to meet the following conditions: $N/2-M \le P_t$, and $N-M \ge P_t$, where $P_t$ is a threshold of a quantity of punctured bits. In one embodiment, when the length of the mother code is designed, the to-be-sent bit includes bits of a quantity for selection, where the quantity is greater than or equal to the threshold. Such a design particularly is applied to an application scenario of retransmission. The length N that is of the mother code and that meets the foregoing condition is selected, so that (N−M) bits may be generated as many as possible for retransmission. Therefore, a coding gain is generated. By using the additional coding gain during decoding, a decoding FER is reduced and decoding performance is improved.

In one embodiment, a threshold $P_t$ of a quantity of punctured bits is determined based on at least one of the following parameters: a code rate R, a code length M, and a rate matching manner including a shortening or puncturing manner. For example, $P_t$ is determined based on the formula $P_t = m\text{\textasciicircum}ceil\,(\log_m M)/K$, where K is a positive integer greater than or equal to 2. $P_t$ may alternatively be a fixed value on which both a receive end and a transmit end agree, for example, 10 or 20.

Polar encoding then is performed on to-be-encoded bits. In one embodiment, a mother code $x_1^N$ (Seq. 0) needs to be obtained, based on A, $A^c$, and a to-be-encoded sequence $u_1^N$, by multiplying $u_1^N$ by an encoding matrix G.

Further, the embodiment further includes the following operation: Interleaving and rate matching are performed on the bit sequence having the length of N, to obtain encoded bits obtained after rate matching is performed and (N−M) unsent bits, where the (N−M) unsent bits may also be considered as encoded bits that are punctured. In one embodiment, interleaving and rate matching are performed on the Seq. 0, to obtain a bit sequence $v_1^M$ (Seq. 1).

In one process, the mother code is interleaved in a specified interleaving manner. The specified interleaving manner includes at least one of the following manners: interleaving is performed in a bit order, interleaving is performed in a bit reversal order, and group interleaving. During the process, the mother code may be interleaved in a rate matching manner, and the interleaved mother code is stored in a circular buffer. During each retransmission, starting from a next bit after previous retransmission is finished, bits in the mother code may be sequentially read until a length of bits that are sent is reached.

For example, interleaving is performed in a predetermined rate matching interleaving manner to obtain the sequence Seq. 1, and interleaved bits are arranged in a sequence that is based on a rate matching priority order. A particular interleaving manner may be in a bit order, may be in a bit reversal order, or may be in a predetermined group interleaving manner. For example, codewords of the mother code are evenly divided into 32 groups, which are respectively labeled as 1, 2, . . . , 31. Each group is arranged in a specific order, to obtain an interleaved bit sequence. The interleaved sequence, namely, a relative position order of all groups, is [0 1 2 4 3 5 6 7 8 16 9 17 10 18 11 19 12 20 13 21 14 22 15 23 24 25 26 28 27 29 30 31].

In the interleaved bit sequence, a bit priority of the interleaved bit sequence is corresponding to a rate matching priority. For example, rate matching is preferentially performed on a bit that ranks higher or lower in the interleaved bit sequence.

Bits in the sequence 1 are sequentially placed in the circular buffer for data transmission, for example, for initial transmission and retransmission of data.

Bits are selected from the Seq. 0 and are added to a to-be-transmitted bit sequence Seq. 2, to generate a to-be-sent bit sequence, and bits in the to-be-sent bit sequences are sequentially stored in the circular buffer. The selected encoded bits may be one or more bits in the bit sequence having the length of N, may be one or more bits in the bit sequence having the length of (N−M), or may be one or more bits in the bit sequence having the length of N and one or more bits in the bit sequence having the length of (N−M).

The bits in the mother code having the length of N are stored in the buffer in a specific order. Starting from a next bit after sending the sequence is finished, the encoded bits in the to-be-transmitted bit sequence Seq. 2 are sequentially read, to send the to-be-transmitted bit sequence.

In a possible manner, if a starting point and a reading direction of the circular buffer are consistent with a starting point and a reading direction of the interleaved sequence, the first P bits are skipped to read remaining M bits. In another retransmission application scenario, when a receive end receives a retransmitted message, the receive end sends to-be-transmitted bits, where the to-be-transmitted bits are located after a last bit that is sent previously, and the to-be-transmitted bits are sequentially sent starting from a next bit after last sending is finished.

By using the HARQ process shown in FIG. 2 as an example, the transmit end may first perform encoding on the entire bit sequence having the length of N. Then, one or more bits in the bit sequence having the length of N are sent for the first time, and the receive end performs channel decoding and performs a CRC check. If the CRC fails, an NACK is fed back. The transmit end sends the to-be-sent bit sequence for the second time, where the to-be-sent bit sequence includes one or more bits in the bit sequence having the length of (N−M), and may further send one or more bits in the bit sent for the first time. The receive end attempts to combine received signals of the first two times for decoding. If the CRC succeeds, an ACK is fed back; and if the CRC still fails, the NACK is fed back. The transmit end sends one or more bits in the (N−M) bits for a $t^{th}$ time, or may send one or more bits in bits sent for the first t−1 times. The receive end combines received signals of the first t times for decoding (t is an integer greater than 2). After $t^{th}$ sending, if the transmit end receives the ACK, it is declared that the sending succeeds; and if the NACK is received and the NACK has been sent for a maximum quantity of times, it is declared that the sending fails.

It should be noted that, a communications system uses repeated retransmission at some code length bit rates, and still uses incremental redundancy (IR) transmission at some code length bit rates. Therefore, the solution in this embodiment may be usually used in a hybrid automatic repeat request-incremental redundancy (HARQ-IR) mode. Therefore, in one embodiment, whether a punctured bit is included in the retransmission may alternatively be determined based on at least one parameter in a code length, a code rate, or a rate matching manner. If the punctured bit is included in the retransmission, the solution in this embodiment is used.

In this application, the to-be-sent sequence having a bit priority is generated, so that a coding gain of the polar code is fully used, and accuracy on a decoding side is improved.

Figure 5:
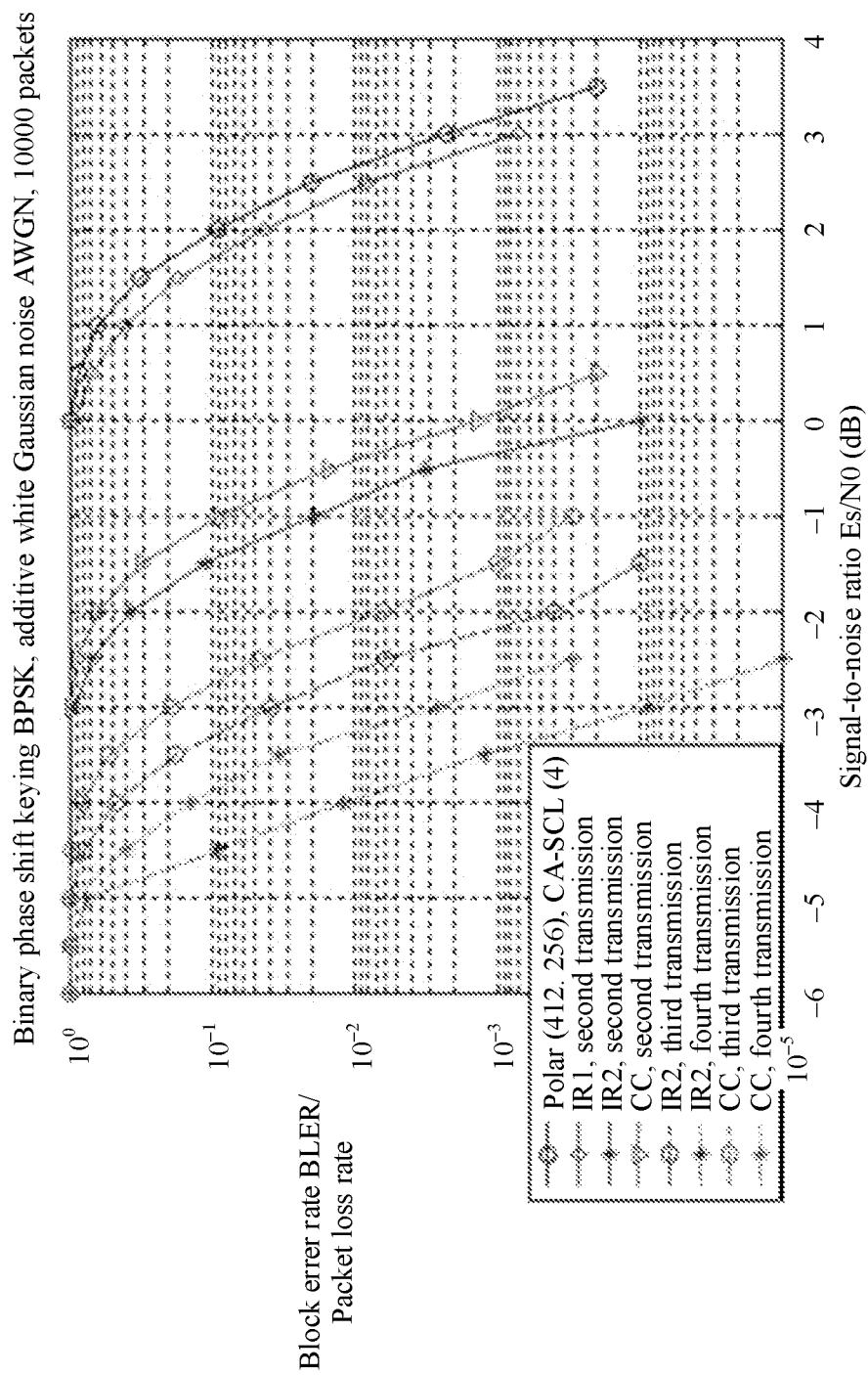
FIG. 5 is a schematic diagram of performance comparison between a solution of this application and an existing retransmission solution.

FIG. 5 is a performance comparison curve of four times of transmission between a solution of this application and existing retransmission solutions. For ease of comparison, the solution of this application is denoted as IR1; the solution in which repeated sending is performed is denoted as CC; and a solution is denoted as IR2. In the solution denoted as IR2, during each retransmission, a transmit end selects, based on reliability corresponding to each information bit in a set, an information bit having relatively low reliability from the set, to directly perform retransmission. A horizontal coordinate Es/N0 represents a signal-to-noise ratio, and a vertical coordinate represents a block error rate (BLER)/packet loss rate. It can be clearly learned from the figure that, because performance during the first retransmission during which an IR2 technology is used is not ideal, subsequent two times of retransmission does not need to be compared with this solution. Set parameters include an additive white Gaussian noise (AWGN) channel and binary phase shift keying (BPSK) modulation. A code length of a mother code is 512, and a length of a sequence sent each time is 412. During the second transmission, the third transmission, and the fourth transmission having same signal-to-noise ratios, a packet loss rate in the IR1 solution is lower than that in the CC solution. Therefore, it can be learned that in the CC solution, because same bits are sent during each retransmission, a generated coding gain is relatively small. However, in the solutions of this application, other than encoded bits for initial transmission, other encoded bits in the mother code are sent. Therefore, an additional coding gain is generated during decoding, so that a decoding FER is reduced, and decoding performance is improved.

According to a data transmission method provided in this embodiment of this application, in this data transmission solution, the additional coding gain is generated during decoding, so that the decoding FER is reduced, and the decoding performance is improved.

Figure 6:
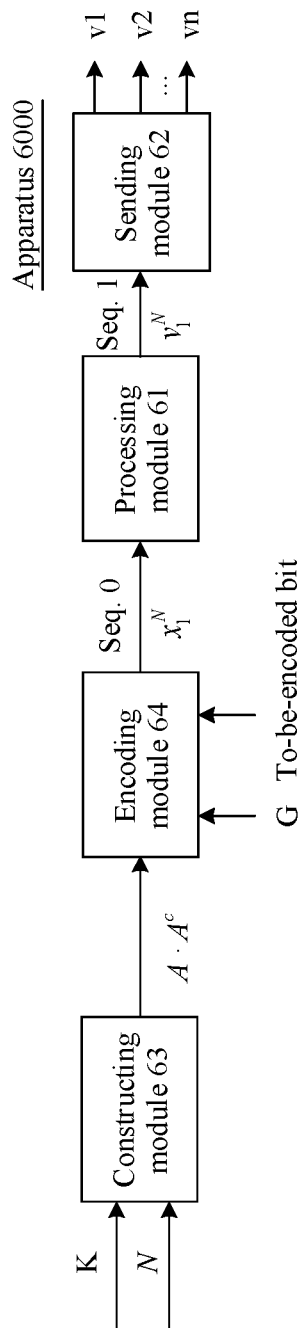
FIG. 6 is a schematic structural diagram of a data transmission apparatus according to an embodiment of this application.

Based on an inventive concept the same as that of the data transmission method shown in FIG. 4, as shown in FIG. 6, an embodiment of this application further provides a data transmission apparatus 6000. The data transmission apparatus 6000 is configured to perform the data transmission method shown in FIG. 4. The apparatus may be applicable to the communications system shown in FIG. 3. In one embodiment, the data transmission apparatus 6000 includes:

a processing module 61, configured to generate a to-be-sent bit sequence, where the to-be-sent bit sequence includes one or more bits in a bit sequence having a length of (N−M), where N is a length of a mother code for polar encoding, M is a length of encoded bits obtained after rate matching is performed on a bit sequence having a length of N, N is m raised to the power of an integer, m is a positive integer greater than 1, M is a positive integer, and N>M; and a sending module 62, configured to send the generated bit sequence.

In this embodiment, polar encoding is first performed on the mother code having the length of N, to obtain that the length of the encoded bits obtained after rate matching is performed is M. The M encoded bits and (N−M) bits are sequentially sent. In one embodiment, the M encoded bits are initially transmitted, and then one or more bits in the (N−M) bits are retransmitted, or one or more bits in the M initially transmitted bits may be retransmitted. The M encoded bits and the (N−M) bits may be stored in a buffer, and the bits in the buffer are sequentially read for sending until a length of bits sent during initial transmission or a length of bits sent during retransmission is reached.

For example, m=2, that is, the length of the mother code is 2 raised to the power of an integer. Certainly, m may alternatively be another value.

Further, interleaving and rate matching are performed on the mother code, to obtain the M encoded bits.

In one embodiment, the data transmission apparatus 6000 further includes a constructing module 63 and an encoding module 64.

The constructing module 63 is configured to construct an information bit sequence number set based on a length of a to-be-encoded sequence and a length of to-be-transmitted information bits.

Before encoded, a polar code is first constructed based on an actual parameter (including the length N of the to-be-encoded sequence $u_1^N$, the length K of the to-be-transmitted information bits, or the like), and a preferred polar channel is selected through online calculation or table reading, to generate an information bit sequence number set A. Some other bits are set to fixed values on which a receive end and a transmit end agree in advance, and are referred to as constant bits, and a set of indexes of the constant bits is represented by using a complementary set $A^c$ of A.

The encoding module 64 is configured to encode to-be-encoded bits.

Polar encoding is performed on the to-be-encoded bits. In one embodiment, a mother code $x_1^N$ (Seq. 0) needs to be obtained, based on A, $A^c$, and a to-be-encoded sequence $u_1^N$, by multiplying $u_1^N$ by an encoding matrix G.

Further, the to-be-sent bit sequence further includes:
one or more bits in the bit sequence having the length of N.

Further, when $m\hat{\,}ceil\ (\log_m M) - M <= P_t$, a value of the length N of the mother code is min ($m\hat{\,}(ceil\ (\log_m M)+1)$, $N_{max}$), where "$m\hat{\,}ceil\ (\log_m M)$" represents an encoding length that is closest to M and that is greater than or equal to M, $P_t$ represents a threshold of a quantity of punctured bits, and $N_{max}$ is a maximum length that is of the mother code and that is preset in a polar code system. When $m\hat{\,}(ceil\ (\log_m M)+1) < N_{max}$, the value of the length N of the mother code is $m\hat{\,}(ceil\ (\log_m M)+1)$; when $m\hat{\,}(ceil\ (\log_m M)+1) > N_{max}$, the value of the length N of the mother code is $N_{max}$; or when $m\hat{\,}(ceil\ (\log_m M)+1) - N_{max}$, the value of the length N of the mother code is $m\hat{\,}(ceil\ (\log_m M)+1)$, or $N_{max}$. $P_t$ is a threshold of a quantity of punctured bits, and $N_{max}$ is a maximum length that is of the mother code and that is set in the system. In this embodiment, when the length of the mother code is designed, it is more considered that the length of the mother code is selected as long as possible, so that (N−M) bits can be generated as many as possible for selection. Such consideration is applied to a retransmission scenario. During retransmission, the (N−M) bits are used for retransmission, to generate a coding gain. By using the additional coding gain during decoding, a decoding FER is reduced and decoding performance is improved. Further, the length N of the mother code should be designed to meet the following conditions: $N/2 - M \le P_t$, and $N - M \ge P_t$, where $P_t$ is the threshold of a quantity of punctured bits. In this embodiment, when the length of the mother code is designed, the to-be-sent bit includes bits of a quantity for selection, where the quantity is greater than or equal to the threshold. Such a design particularly is applied to an application scenario of retransmission. The length N that is of the mother code and that meets the foregoing condition is selected, so that (N−M) bits may be generated as many as possible for retransmission. Therefore, a coding gain is generated. By using the additional coding gain during decoding, a decoding FER is reduced and decoding performance is improved.

Further, a threshold $P_t$ of a quantity of punctured bits is determined based on at least one of the following parameters: a code rate R, a code length M, and a rate matching manner including a shortening or puncturing manner. For example, $P_t$ is determined based on the formula $P_t = m\hat{\,}ceil\ (\log_m M)/K$, where K is a positive integer greater than or equal to 2. $P_t$ may alternatively be a fixed value on which both a receive end and a transmit end agree, for example, 10 or 20.

Further, the apparatus is a network device or a terminal device.

According to a data transmission apparatus provided in this embodiment of this application, in this data transmission solution, the additional coding gain is generated during decoding, so that the decoding FER is reduced, and the decoding performance is improved.

An embodiment of this application further provides a data transmission system, and the data transmission system includes the network device and the terminal device, where the network device/terminal device includes the foregoing data transmission apparatus.

Figure 7:
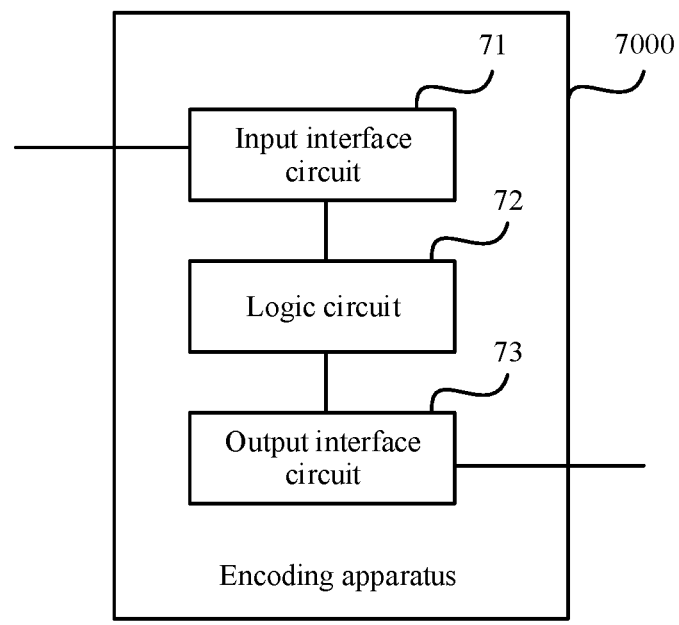
FIG. 7 is a schematic structural diagram of an encoding apparatus according to an embodiment of this application.

Based on the data transmission method shown in FIG. 4, as shown in FIG. 7, an embodiment of this application further provides an encoding apparatus 7000. The encoding apparatus 7000 is configured to perform the data transmission method shown in FIG. 4. The apparatus may be applicable to the communications system shown in FIG. 3. A part or all of the data transmission method shown in FIG. 4 may be implemented by hardware, or may be implemented by software. When the data transmission method is implemented by hardware, the encoding apparatus includes: an input interface circuit 71, configured to obtain a bit sequence when a length of a mother code is N; a logic circuit 72, configured to generate a to-be-sent bit sequence; and an output interface circuit 73, configured to output the to-be-sent bit sequence, where the to-be-sent bit sequence includes one or more bits in a bit sequence having a length of (N−M), where N is the length of the mother code for polar encoding, M is a length of encoded bits obtained after rate matching is performed on a bit sequence having a length of N, N is m raised to the power of an integer, m is a positive integer greater than 1, M is a positive integer, and N>M.

Further, the to-be-sent bit sequence further includes:
one or more bits in the bit sequence having the length of N.

Further, when m^ceil $(\log_m M)$−M<=$P_t$, a length of the to-be-sent bit sequence is min (m^(ceil $(\log_m M)$+1), Nmax), where $P_t$ is a threshold of a quantity of punctured bits, and Nmax is a maximum length of the mother code.

Further, when N meets the following conditions: N/2−M≤$P_t$, and N−M≥$P_t$, a length of the to-be-sent bit sequence is min (m^(ceil $(\log_m M)$+1), Nmax), where $P_t$ is a threshold of a quantity of punctured bits, and Nmax is a maximum length of the mother code.

Further, the apparatus is a network device or a terminal device.

For functions performed by the logic circuit in the foregoing data transmission apparatus, refer to the descriptions in the foregoing method embodiments. Details are not described herein again.

In one embodiment, the encoding apparatus may be a chip or an integrated circuit.

Figure 8:
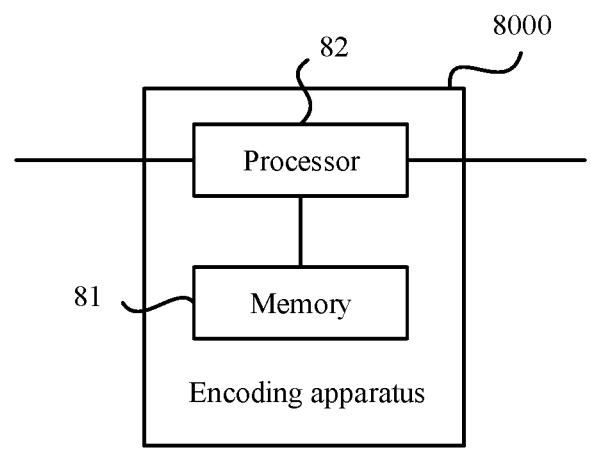
FIG. 8 is a schematic structural diagram of another encoding apparatus according to an embodiment of this application.

In one embodiment, when some or all of the encoding methods in the foregoing embodiments are implemented by software, as shown in FIG. 8, an encoding apparatus 8000 includes: a memory 81, configured to store a program; and a processor 82, configured to execute the program stored in the memory 81, where when the program is executed, the encoding apparatus is enabled to obtain a bit sequence when a length of a mother code is N; generate a to-be-sent bit sequence; and output the to-be-sent bit sequence. The apparatus may be applicable to the communications system shown in FIG. 3.

In one embodiment, the memory 81 may be a physically independent unit, or may be integrated together with the processor 82.

In one embodiment, when a part or all of the data transmission method according to the foregoing embodiment in FIG. 4 is implemented by software, the encoding apparatus 8000 may include only the processor 82. The memory 81 configured to store the program is located outside the encoding apparatus 8000, and the processor 82 is connected to the memory 81 by using a circuit/wire, and is configured to read and execute the program stored in the memory 81.

The processor 82 may be a central processing unit (CPU), a network processor (NP), or a combination of a CPU and an NP.

The processor 82 may further include a hardware chip. The hardware chip may be an application-specific integrated circuit (ASIC), a programmable logic device (PLD), or a combination thereof. The PLD may be a complex programmable logic device (CPLD), a field-programmable logic gate array (FPGA), a generic array logic (GAL), or any combination thereof.

The memory 81 may include a volatile memory, for example, a random access memory (RAM). The memory 81 may alternatively include a non-volatile memory, for example, a flash memory, a hard disk drive (HDD), or a solid-state drive (SSD). The memory 81 may alternatively include a combination of the foregoing types of memories.

Figure 9:
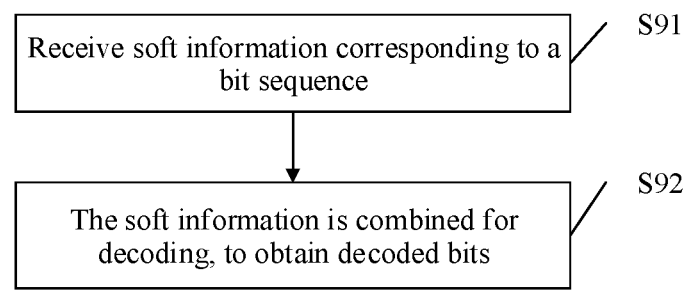
FIG. 9 is a schematic flowchart of a decoding method according to an embodiment of this application.

FIG. 9 is a schematic flowchart of a decoding method according to an embodiment of this application. The method may include the following operations:

S91: Receive soft information corresponding to a bit sequence, where the soft information includes soft information corresponding to one or more bits in a bit sequence having a length of (N−M), where N is a length of a mother code for polar encoding, M is a length of encoded bits obtained after rate matching is performed on a bit sequence having a length of N, N is m raised to the power of an integer, m is a positive integer greater than 1, M is a positive integer, and N>M.

S92: Combine the soft information for decoding, to obtain decoded bits.

Further, the to-be-sent bit sequence further includes:
one or more bits in the bit sequence having the length of N.

Figure 10:
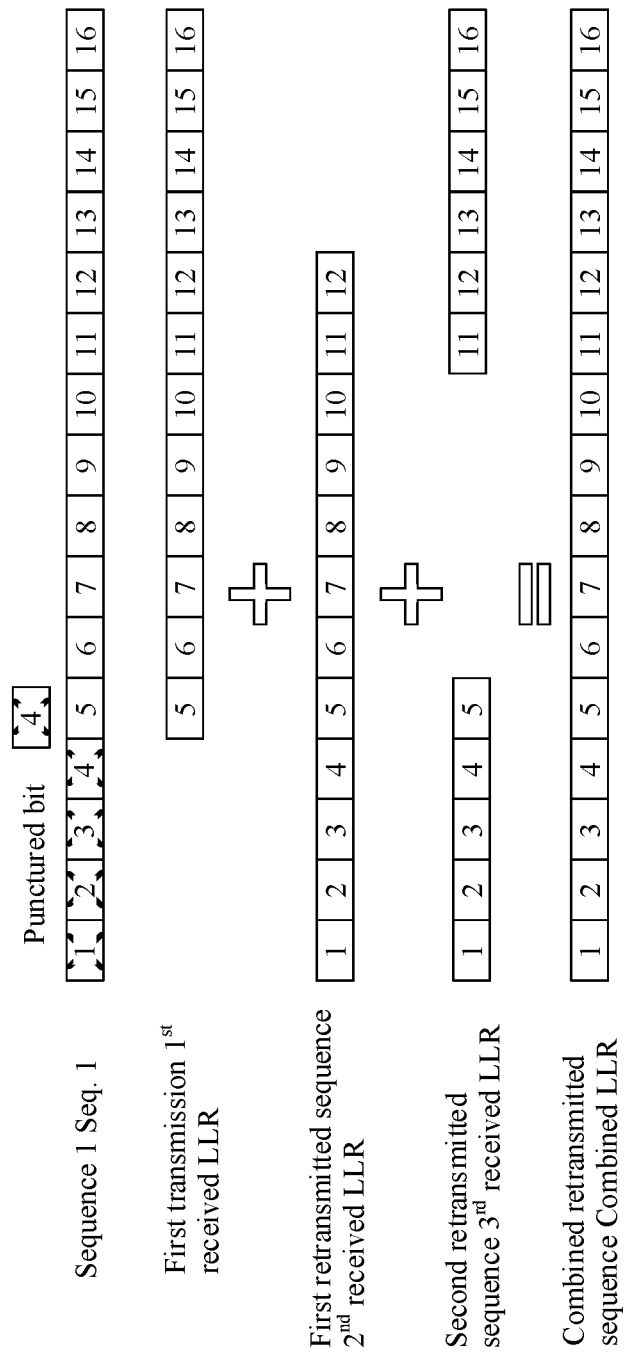
FIG. 10 is a schematic diagram of combining soft information received by a receive end.

During implementation, after a receive end receives an initially transmitted sequence and a retransmitted sequence, to combine soft information received by the receive end, only a one-dimensional matrix $y_1^N$ having a size of N is maintained, where an initial value of $y_1^N$ is 0. Soft information received by the receive end each time is added, based on a position of each bit in the mother code, to soft information located at a corresponding position in $y_1^N$. In one embodiment, because rate matching, interleaving, buffering, and the like need to be performed during bit transmission, a position of each bit in the mother code may not be aligned with a position in $y_1^N$. Therefore, when receiving the initially transmitted sequence or the retransmitted sequence, the receive end needs to align a position of the initially transmitted sequence or the retransmitted sequence in the mother code with a position in $y_1^N$. In one embodiment, assuming that retransmitted soft information received from a channel is $s_1^M$, soft information in $y_1^N$ is updated to $y_i=y_i+s_j$, f(i)=j, where j is a position of a bit in s, and i is a position of a bit in y. Therefore, the receive end needs to reserve only a buffer having a size of a Seq. 2 for combining the soft information. For example, FIG. 10 is a schematic diagram of a process of combining soft information received by the receive end. As shown in FIG. 10, if a length of an initially transmitted sequence Seq. 0 is 16 and 4 bits are punctured, the receive end needs to maintain a one-dimensional matrix $y_1^N$ in which N=16, and an initial value of $y_1^N$ is set to 0. When the initially transmitted sequence is received (that is, 1st received LLR for first transmission), a position of a bit in the Seq. 0 and a position of a bit in $y_1^N$ are aligned, and the Seq. 0 is combined into $y_1^N$. When a retransmitted sequence of the first time (2nd received LLR) and a retransmitted sequence of the second time (3rd received LLR) are received, a position of each bit in the retransmission sequence and a position of a bit in $y_1^N$ are aligned, and received retransmitted sequences are combined into $y_1^N$. Alternatively, after the initially transmitted sequence and all retransmitted sequences are received, the initially transmitted sequence and the all retransmitted sequences are combined into $y_1^N$.

According to a decoding method provided in this embodiment of this application, an additional coding gain is generated during decoding, so that a decoding FER is reduced, and decoding performance is improved.

Figure 11:
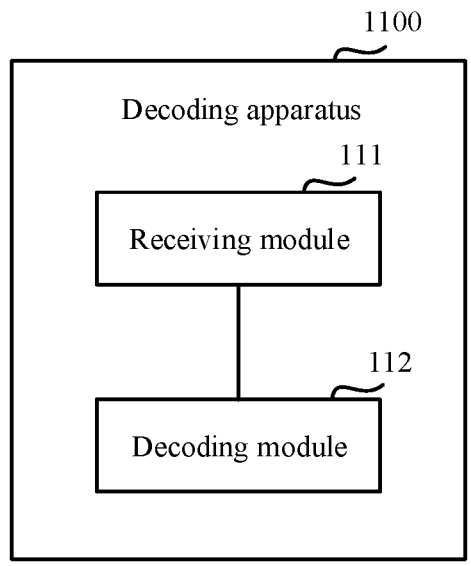
FIG. 11 is a schematic structural diagram of a decoding apparatus according to an embodiment of this application.

Based on an inventive idea the same as the decoding method provided in the foregoing embodiment, as shown in FIG. 11, an embodiment of this application further provides a decoding apparatus 1100. The decoding apparatus 1100 may be configured to perform the decoding method provided in the embodiments of this application. The apparatus may be applicable to the communications system shown in FIG. 3. The decoding apparatus 1100 includes:

a receiving module 111, configured to receive soft information corresponding to a bit sequence; and a decoding module 112, configured to combine the soft information for decoding, to obtain decoded bits.

Figure 12:
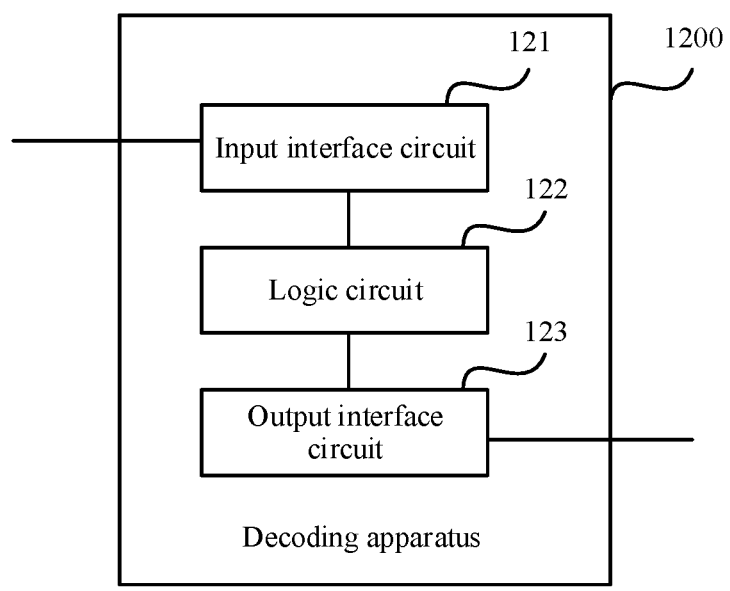
FIG. 12 is a schematic structural diagram of another decoding apparatus according to an embodiment of this application.

Based on an inventive idea the same as the decoding method provided in the foregoing embodiment, as shown in FIG. 12, an embodiment of this application further provides a decoding apparatus 1200. The decoding apparatus 1200 is configured to perform the foregoing decoding method. The apparatus may be applicable to the communications system shown in FIG. 3. A part or all of the foregoing decoding method may be implemented by hardware, or may be implemented by software. When a part or all of the foregoing decoding method is implemented by hardware, the decoding apparatus 1200 includes: an input interface circuit 121, configured to receive soft information corresponding to a bit sequence; a logic circuit 1102, configured to perform the foregoing decoding method; and an output interface circuit 1103, configured to output decoded bits.

In one embodiment, the decoding apparatus 1200 may be a chip or an integrated circuit.

Figure 13:
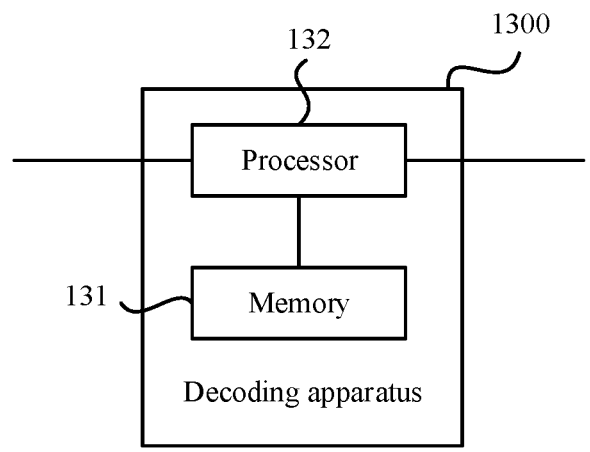
FIG. 13 is a schematic structural diagram of still another encoding apparatus according to an embodiment of this application.

In one embodiment, when a part or all of the decoding method in the foregoing embodiments are implemented by using software, as shown in FIG. 13, a decoding apparatus 1300 includes: a memory 131, configured to store a program; and a processor 132, configured to execute the program stored in the memory 131, where when the program is executed, the decoding apparatus 1300 is enabled to implement the decoding method provided in the foregoing embodiments.

In one embodiment, the memory 131 may be a physically independent unit, or may be integrated together with the processor 132.

In one embodiment, when a part or all of the decoding method of the foregoing embodiments are implemented by software, the decoding apparatus 1300 may alternatively include only the processor 132. The apparatus may be applicable to the communications system shown in FIG. 3. The memory 131 configured to store the program is located outside the decoding apparatus 1300, and the processor 132 is connected to the memory 131 by using a circuit/wire, and is configured to read and execute the program stored in the memory 131.

The processor 132 may be a central processing unit (CPU), a network processor (NP), or a combination of a CPU and an NP.

The processor 132 may further include a hardware chip. The hardware chip may be an application-specific integrated circuit (ASIC), a programmable logic device (PLD), or a combination thereof. The PLD may be a complex programmable logic device (CPLD), a field-programmable logic gate array (FPGA), a generic array logic (GAL), or any combination thereof.

The memory 131 may include a volatile memory, for example, a random-access memory (RAM). The memory 131 may alternatively include a non-volatile memory, for example, a flash memory, a hard disk drive (HDD), or a solid-state drive (SSD). The memory 131 may alternatively include a combination of the foregoing types of memories.

Figure 14:
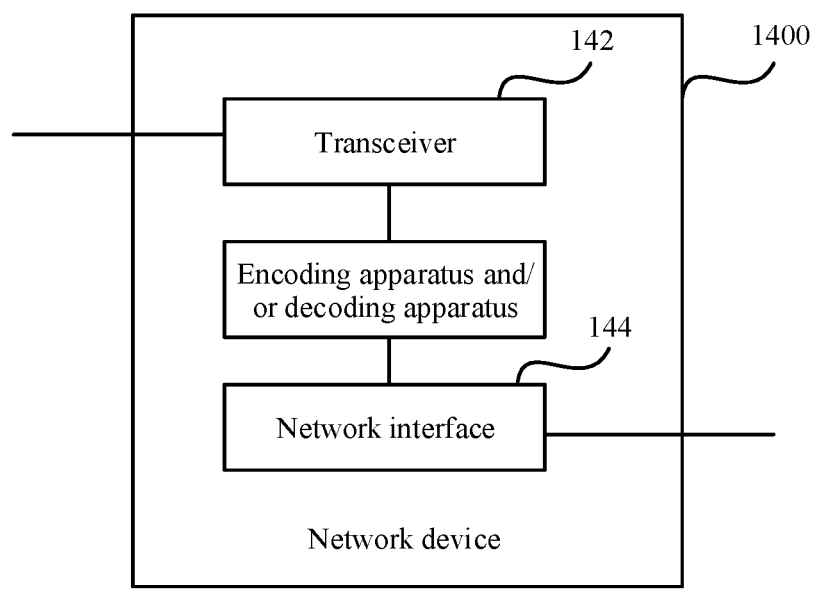
FIG. 14 is a schematic structural diagram of a network device according to an embodiment of this application.

An embodiment of this application further provides a network device. Referring to FIG. 14, the foregoing encoding apparatus and/or decoding apparatus may be installed in a network device 1400. The apparatus may be applicable to the communications system shown in FIG. 3. In addition to the foregoing encoding apparatus and decoding apparatus, the network device 1400 may further include a transceiver 142. A bit sequence encoded by the encoding apparatus is subject to subsequent change or processing and then sent by the transceiver 142 to a terminal device, or the transceiver 142 is further configured to receive information/data from the terminal device. The information/data is subject to a series of processing and is converted into a to-be-decoded sequence, and the to-be-decoded sequence is processed by the decoding apparatus to obtain a decoded sequence. The network device 1400 may further include a network interface 144, configured to communicate with another network device.

Figure 15:
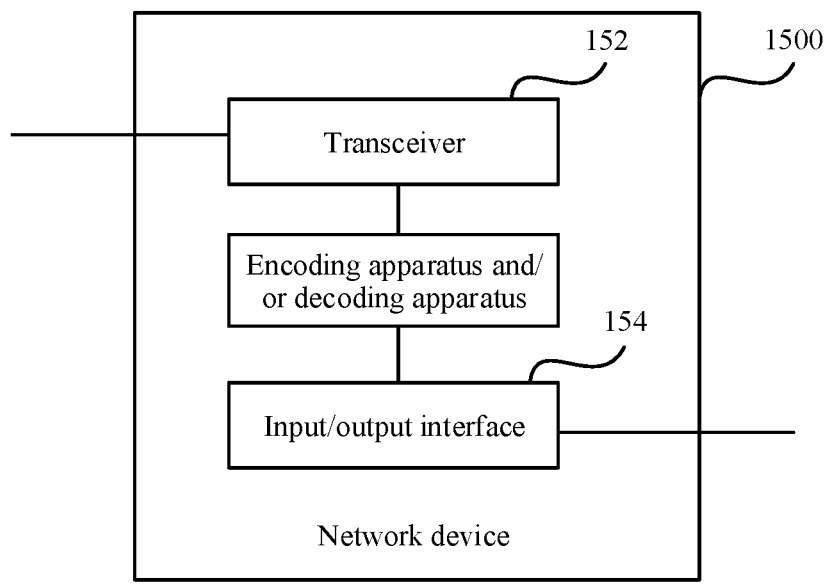
FIG. 15 is a schematic structural diagram of a terminal device according to an embodiment of this application.

Similarly, as shown in FIG. 15, the foregoing encoding apparatus and/or the decoding apparatus may be installed in a terminal device 1500. The apparatus may be applicable to the communications system shown in FIG. 3. In addition to the foregoing encoding apparatus and decoding apparatus, the terminal device 1500 may further include a transceiver 152. A bit sequence encoded by the encoding apparatus is subject to subsequent change or processing and then sent by the transceiver 152 to a network device, or the transceiver 152 is further configured to receive information/data from the network device. The information/data is subject to a series of processing and is converted into a to-be-decoded sequence, and the to-be-decoded sequence is processed by the decoding apparatus to obtain a decoded sequence. The terminal 1500 may further include an input/output interface 154, configured to receive information input by a user. Information that needs to be sent to the network device needs to be processed by an encoder and then sent by the transceiver 152 to the network device. After subject to subsequent processing, data decoded by a decoder may alternatively be presented to the user by using the input/output interface 154.

An embodiment of this application further provides a computer storage medium, storing a computer program. The computer program is configured to perform the data transmission method shown in FIG. 4 and the decoding method provided in the foregoing embodiments.

An embodiment of this application further provides a polar code encoding apparatus, including any encoding apparatus in FIG. 7 to FIG. 9 and any decoding apparatus in FIG. 11 to FIG. 13.

An embodiment of this application further provides a computer program product including an instruction. When the computer program product is run on a computer, the computer is enabled to perform the data transmission method shown in FIG. 4 and the decoding method provided in the foregoing embodiments.

A person of ordinary skill in the art may be aware that, in combination with the examples described in the embodiments disclosed in this specification, units and algorithm operations may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing described system, apparatus, and unit, refer to a corresponding process in the foregoing method embodiments, and details are not described herein again.

In the several embodiments provided in this application, it should be understood that the disclosed system, apparatus, and method may be implemented in other manners. For example, the foregoing described apparatus embodiments are merely examples. For example, the unit division is merely logical function division and may be another division during actual implementation. For example, a plurality of units or components may be combined or integrated into another system, or some features may be ignored or not performed. In addition, the displayed or discussed mutual coupling or direct coupling or communication connections may be implemented by using some interfaces. The indirect coupling or communication connections between the apparatuses or units may be implemented in electronic, mechanical, or other forms.

The units described as separate parts may or may not be physically separate, and parts displayed as units may or may not be physical units, that is, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to the embodiments of this application are all or partially generated. The computer may be a general-purpose computer, a dedicated computer, a computer network, or other programmable apparatuses. The computer instruction may be stored in a computer-readable storage medium, or may be transmitted by using the computer-readable storage medium. The computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device such as a server or a data center, integrating one or more usable media. The usable medium may be a magnetic medium (for example, a floppy disk, a hard disk, or a magnetic tape), an optical medium (for example, a digital versatile disc (DVD), a semiconductor medium (for example, a solid-state drive (SSD)), or the like.

A person of ordinary skill in the art may understand that all or some of the processes of the methods in the foregoing embodiments may be implemented by a computer program instructing relevant hardware. The program may be stored in a computer-readable storage medium. When the program runs, the processes of the methods in the embodiments are performed. The foregoing storage medium includes: any medium that can store program code, for example, a read-only memory (ROM), a random access memory (RAM), a magnetic disk, or an optical disc.

What is claimed is:

1. A data transmission method comprising:
   performing, by a processor, polar encoding on a mother code having a length of N bits long;
   performing, by the processor, rate matching on the mother code to obtain M encoded bits and N-M unsent bits, wherein N is m raised to a power of an integer, m is a positive integer greater than 1, M is a positive integer, and N>M;
   transmitting, by the processor, the M encoded bits;
   generating, by the processor, a to-be-sent bit sequence, wherein the to-be-sent bit sequence comprises one or more bits in the N−M unsent bits; and
   sending, by the processor, the generated to-be-sent bit sequence in response to receiving a negative acknowledgement, wherein when $m\hat{}ceil(\log_m M)-M<=P_t$, a value of a length of the to-be-sent bit sequence is min $(m\hat{}ceil(\log_m M)+1)$, Nmax); or
   when a length N of the mother code is selected based on a threshold of a quantity of punctured bits $P_t$ to meet the following conditions: $N/2-M \leq P_t$, and $N-M \geq P_t$, a value of the length N of the mother code is min $(m\hat{}ceil(\log_m M)+1)$, Nmax), wherein $P_t$ is a threshold of a quantity of punctured bits, and Nmax is a maximum length of the mother code.

2. The method according to claim 1, wherein the to-be-sent bit sequence further comprises:
   one or more bits in the N encoded bits.

3. A data transmission apparatus comprising:
   a processor; and
   a memory coupled to the processor to store instructions, which when executed by the processor, cause the processor to perform operations, the operations including:
   performing polar encoding on a mother code having a length of N bits long;
   performing rate matching on the mother code to obtain M encoded bits and N−M unsent bits, wherein N is m raised to a power of an integer, m is a positive integer greater than 1, M is a positive integer, and N>M;
   transmitting, by the processor, the M encoded bits;
   generating the to-be-sent bit sequence, wherein the to-be-sent bit sequence comprises one or more bits in the N−M unsent bits; and
   sending the generated to-be-sent bit sequence in response to receiving a negative acknowledgement, wherein when $m\hat{}ceil(\log_m M)-M<=P_t$, a value of a length of the to-be-sent bit sequence is min$(m\hat{}(ceil(\log_m M)+1)$, Nmax); or
   when a length N of the mother code is selected based on a threshold of a quantity of punctured bits $P_t$ to meet the following conditions: $N/2-M \leq P_t$, and $N-M \geq P_t$, a value of the length N of the mother code is min $(m\hat{}(ceil(\log_m M)+1)$, Nmax), wherein $P_t$ is a threshold of a quantity of punctured bits, and Nmax is a maximum length of the mother code.

4. The apparatus according to claim 3, wherein the to-be-sent bit sequence further comprises:
   one or more bits in the N encoded bits.

5. The apparatus according to claim 3, wherein the apparatus is a network device or a terminal device.

6. A non-transitory machine-readable medium having instructions stored therein, which when executed by a processor, cause the processor to perform operations, the operations comprising:
   performing polar encoding on a mother code having a length of N bits long;
   performing rate matching on the mother code to obtain M encoded bits and N−M unsent bits, wherein N is m raised to a power of an integer, m is a positive integer greater than 1, M is a positive integer, and N>M;

transmitting the M encoded bits;

generating the to-be-sent bit sequence, wherein the to-be-sent bit sequence comprises one or more bits in the N−M unsent bits; and sending the generated to-be-sent bit sequence in response to receiving a negative acknowledgement, wherein when m^ceil $(\log_m M)-M \leq P_t$, a value of a length of the to-be-sent bit sequence is min (m^(ceil $(\log_m M)+1$), Nmax); or when a length N of the mother code is selected based on a threshold of a quantity of punctured bits $P_t$ to meet the following conditions: $N/2-M \leq P_t$, and $N-M \geq P_t$, a value of the length N of the mother code is min (m^(ceil $(\log_m M)+1$), Nmax), wherein $P_t$ is a threshold of a quantity of punctured bits, and Nmax is a maximum length of the mother code.

7. The non-transitory machine-readable medium according to claim 6, wherein the to-be-sent bit sequence further comprises:

one or more bits in the N encoded bits.

8. The method according to claim 1, wherein the M encoded bits and the (N−M) bits are stored in a buffer.

9. The apparatus according to claim 3, wherein the M encoded bits and the (N−M) bits are stored in a buffer.

10. The non-transitory machine-readable medium according to claim 6, wherein the M encoded bits and the (N−M) bits are stored in a buffer.

* * * * *